(12) United States Patent
Park et al.

(10) Patent No.: US 9,967,974 B2
(45) Date of Patent: *May 8, 2018

(54) COMPOSITION AND METHOD FOR FORMING CONDUCTIVE PATTERN, AND RESIN STRUCTURE HAVING CONDUCTIVE PATTERN THEREON

(71) Applicant: LG CHEM, LTD., Seoul (KR)

(72) Inventors: Chee-Sung Park, Daejeon (KR); Cheol-Hee Park, Daejeon (KR); Shin Hee Jun, Daejeon (KR); Sang Yun Jung, Daejeon (KR); Han Nah Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 129 days.

This patent is subject to a terminal disclaimer.

(21) Appl. No.: 14/777,670

(22) PCT Filed: Apr. 17, 2014

(86) PCT No.: PCT/KR2014/003360
§ 371 (c)(1),
(2) Date: Sep. 16, 2015

(87) PCT Pub. No.: WO2014/175599
PCT Pub. Date: Oct. 30, 2014

(65) Prior Publication Data
US 2016/0174370 A1    Jun. 16, 2016

(30) Foreign Application Priority Data

Apr. 26, 2013 (KR) .................. 10-2013-0046806
Apr. 16, 2014 (KR) .................. 10-2014-0045363

(51) Int. Cl.
C23C 18/16 (2006.01)
C23C 18/20 (2006.01)
(Continued)

(52) U.S. Cl.
CPC .............. *H05K 1/036* (2013.01); *C08J 7/123* (2013.01); *C23C 18/161* (2013.01);
(Continued)

(58) Field of Classification Search
CPC .............. C23C 18/1608; C23C 18/161; C23C 18/1612; C23C 18/1641; C23C 18/1658;
(Continued)

(56) References Cited

U.S. PATENT DOCUMENTS

| 3,930,963 | A | * | 1/1976 | Polichette | .............. | H05K 3/185 |
| | | | | | | 205/125 |
| 5,599,592 | A | | 2/1997 | Laude | | |

(Continued)

FOREIGN PATENT DOCUMENTS

CN    101747650 A    6/2010
CN    102391633 A    3/2012
(Continued)

OTHER PUBLICATIONS

Marquardt et al., "Crystal chemistry and electrical properties of the delafossite structure", 2006, Thin Solid Films, vol. 496, pp. 146-156.*

(Continued)

*Primary Examiner* — Helene Klemanski
(74) *Attorney, Agent, or Firm* — Dentons US LLP (57) ABSTRACT

The present invention relates to a composition for forming a conductive pattern, which is able to form a fine conductive pattern onto a variety of polymer resin products or resin layers by a very simple process, a method for forming the conductive pattern using the same, and a resin structure having the conductive pattern. The composition for forming the conductive pattern, including a polymer resin; and a non-conductive metal compound containing a first metal and a second metal, in which the non-conductive metal com- (Continued)

pound has a three-dimensional structure containing a plurality of first layers that contains at least one metal of the first and second metals and has edge-shared octahedrons two-dimensionally connected to each other and a second layer that contains a metal different from that of the first layer and is arranged between the neighboring first layers; and a metal core containing the first or second metal or an ion thereof is formed from the non-conductive metal compound by electromagnetic irradiation.

16 Claims, 9 Drawing Sheets

(51) Int. Cl.
  *C23C 18/40* (2006.01)
  *C08J 7/12* (2006.01)
  *H05K 1/03* (2006.01)
  *H05K 3/02* (2006.01)
  *H05K 3/18* (2006.01)
  *H01B 1/22* (2006.01)

(52) U.S. Cl.
  CPC ...... *C23C 18/1608* (2013.01); *C23C 18/1612* (2013.01); *C23C 18/1641* (2013.01); *C23C 18/1658* (2013.01); *C23C 18/204* (2013.01); *H01B 1/22* (2013.01); *H05K 1/0373* (2013.01); *H05K 3/027* (2013.01); *H05K 3/185* (2013.01); *C23C 18/405* (2013.01); *H05K 2201/0236* (2013.01); *H05K 2201/09118* (2013.01); *H05K 2203/107* (2013.01)

(58) Field of Classification Search
  CPC ...... C23C 18/204; C23C 18/405; C08J 7/123; H01B 1/22; H05K 1/036; H05K 1/0373; H05K 3/027; H05K 3/185; H05K 2203/107
  USPC ................. 106/1.05, 1.22, 1.23; 252/519.33; 427/553
  See application file for complete search history.

(56) References Cited

U.S. PATENT DOCUMENTS

| | | | |
|---|---|---|---|
| 7,060,421 B2 | 6/2006 | Naundorf et al. | |
| 9,668,342 B2* | 5/2017 | Jun | C23C 18/1612 |
| 2006/0083939 A1* | 4/2006 | Dunbar | H05K 3/185 428/473.5 |
| 2009/0292051 A1* | 11/2009 | Li | C23C 18/1641 524/404 |
| 2011/0251326 A1 | 10/2011 | Van Hartingsveldt et al. | |
| 2011/0281135 A1 | 11/2011 | Gong et al. | |
| 2013/0168133 A1* | 7/2013 | Schrauwen | H05K 3/185 427/555 |
| 2014/0290530 A1* | 10/2014 | Gong | C23C 18/1612 106/1.26 |
| 2016/0234933 A1* | 8/2016 | Jun | H05K 1/0373 |
| 2016/0295704 A1* | 10/2016 | Park | H01B 1/22 |

FOREIGN PATENT DOCUMENTS

| | | | |
|---|---|---|---|
| EP | 2 354 185 A1 | | 8/2011 |
| EP | 2 390 282 A1 | | 11/2011 |
| EP | 2584065 A2 | | 4/2013 |
| JP | 2002-158229 A | | 5/2002 |
| JP | 2002-158418 A | | 5/2002 |
| JP | 2002158228 A | | 5/2002 |
| JP | 2004534408 A | | 11/2004 |
| JP | 2006-309202 A | | 11/2006 |
| JP | 2008140972 A | | 6/2008 |
| JP | 2009522786 A | | 6/2009 |
| JP | 2010536947 A | | 12/2010 |
| JP | 2012524169 | * | 10/2012 |
| JP | 2012524169 A | | 10/2012 |
| KR | 10-2004-0021614 A | | 3/2004 |
| KR | 10-2004-0055197 A | | 6/2004 |
| KR | 10-0614139 B1 | | 8/2006 |
| KR | 10-0651519 B1 | | 11/2006 |
| KR | 10-2011-0018319 A | | 2/2011 |
| KR | 10-2011-0112860 A | | 10/2011 |
| WO | 2007-112878 A1 | | 10/2007 |
| WO | 2014161493 A1 | | 10/2014 |
| WO | WO 2014/175598 A1 | * | 10/2014 |
| WO | WO 2015/046840 A1 | * | 4/2015 |
| WO | WO 2015/076633 A1 | * | 5/2015 |

OTHER PUBLICATIONS

English translation of KR 10-2004-0055197, dated Jun. 2004; 17 pages.*

Gong, Qing et al.; Plastic composition and its application, and selective metalization method of plastic surface, XP002760299; Jun. 29, 2010; 23 pages; Chemical Abstracts Service, Columbus, Ohio, USA.

* cited by examiner

After Plating     After Cross-cut & Adhesion Test

COMPOSITION AND METHOD FOR FORMING CONDUCTIVE PATTERN, AND RESIN STRUCTURE HAVING CONDUCTIVE PATTERN THEREON

This application is a 35 USC § 371 National Stage entry of International Application No. PCT/KR2014/003360 filed on Apr. 17, 2014, and claims the benefit of Korean Application No. 10-2013-0046806 filed on Apr. 26, 2013, and Korean Application No. 10-2014-0045363 filed on Apr. 16, 2014 all of which are incorporated by reference in their entirety for all purposes as if fully set forth herein.

TECHNICAL FIELD

The present invention relates to a composition for forming a conductive pattern, which is able to form a fine conductive pattern onto a variety of polymer resin products or resin layers by a very simple process, a method for forming the conductive pattern using the same, and a resin structure having the conductive pattern.

BACKGROUND

With the recent development of microelectronic technology, a need for structures having a fine conductive pattern formed on the surface of a polymer resin substrate (or product) such as a variety of resin products or resin layers has grown. The conductive pattern on the surface of the polymer resin substrate and the structures can be applied to form various objects such as antenna integrated into the case of a mobile phone, a variety of sensors, MEMS structures or RFID tags.

As such, with increasing interest in the technology of forming the conductive pattern on the surface of the polymer resin substrate, several technologies thereof have been proposed. However, a more effective method for these technologies has not been suggested yet.

For example, according to the previous technology, a method for forming the conductive pattern by forming a metal layer on the surface of the polymer resin substrate and then applying photolithography, or a method for forming the conductive pattern by printing a conductive paste can be considered. However, when the conductive pattern is formed according to this technology, there are disadvantages that a process or equipment needed becomes too complicated, or it is difficult to form an excellent fine conductive pattern.

Accordingly, there is a continuous need to develop a technology capable of more effectively forming the fine conductive pattern on the surface of the polymer resin substrate by a simpler process.

DISCLOSURE

Technical Problem

The present invention provides a composition for forming a conductive pattern, which is able to form a fine conductive pattern on a variety of polymer resin products or resin layers by a very simple process, and a method for forming the conductive pattern using the same.

Further, the present invention provides a resin structure having the conductive pattern which is formed from the composition for forming the conductive pattern or the like.

Technical Solution

The present invention provides a composition for forming a conductive pattern by electromagnetic irradiation, including a polymer resin; and a non-conductive metal compound containing a first metal and a second metal, wherein the non-conductive metal compound has a three-dimensional structure containing a plurality of first layers that contains at least one metal of the first and second metals and has edge-shared octahedrons two-dimensionally connected to each other, and a second layer that contains a metal different from that of the first layer and is arranged between the neighboring first layers; and wherein a metal core containing the first or second metal or an ion thereof is formed from the non-conductive metal compound by electromagnetic irradiation.

The composition for forming the conductive pattern may exhibit reflectivity of approximately 25% or less, or approximately 10 to 25% with respect to a laser electromagnetic wave having a wavelength of approximately 1000 nm to 1200 nm.

Further, in the composition for forming the conductive composition, the metals contained in the second layer of the non-conductive metal compound may connect the two-dimensional structures to each other, for example, by connecting vertices of the octahedrons to each other between the neighboring first layers. The non-conductive metal compound can be defined as a compound having a space group of $R\bar{3}m$ or $P6_3/mmc$.

More specifically, the non-conductive metal compound is a compound containing the first and second metals and X (oxygen, nitrogen, or sulfur), and the non-conductive metal compound may have a three-dimensional structure containing a plurality of first layers in which at least one metal of the first and second metals and atoms of X form edge-shared octahedrons arranged in the two-dimensionally connected structure, and a second layer that contains a metal different from that of the first layer, in which the metal connects the two-dimensional structure of the octahedrons to each other between the neighboring first layers.

Specific example of the non-conductive metal compound may be one or more compounds selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$ and $CuSnO_2$, and therefore, a metal core is formed well by electromagnetic irradiation so as to form a more excellent conductive pattern.

Meanwhile, when the above described composition for forming the conductive pattern is irradiated with laser electromagnetic wave having a wavelength of approximately 1000 nm to 1200 nm at an average power of approximately 5 to 20 W, the metal core is formed. By controlling the conditions of laser electromagnetic irradiation, the metal core can be more effectively formed on the polymer resin of the composition, and therefore, a more excellent conductive pattern can be formed.

In the composition for forming the conductive pattern, the polymer resin may include a thermosetting resin or a thermoplastic resin, and more specific example thereof may be one or more selected from the group consisting of a polyalkylene terephthalate resin such as an ABS resin, a polybutyleneterephthalate resin, a polyethyleneterephthalate resin or the like, a polycarbonate resin, a polypropylene resin, and a polyphthalamide resin.

Further, in the composition for forming the conductive pattern, the non-conductive metal compound may be included in an amount of approximately 1 to 10% by weight, with respect to the total composition, and the polymer resin may be included in the remaining amount.

The composition for forming the conductive pattern may further include one or more additives selected from the group consisting of a heat stabilizer, a UV stabilizer, a flame retardant, a lubricant, an antioxidant, an inorganic filler, a color additive, an impact modifier and a functional modifier, in addition to the above described polymer resin and the predetermined non-conductive metal compound.

Meanwhile, the present invention provides a method for forming a conductive pattern on a polymer resin substrate such as a resin product or a resin layer by direct electromagnetic irradiation using the above described composition for forming the conductive pattern. The method for forming the conductive pattern may include the steps of molding the composition for forming the conductive pattern to a resin product or applying it to another product so as to form a resin layer; irradiating electromagnetic wave to a predetermined region of the resin product or the resin layer so as to generate metal cores containing the first or second metal or the ion thereof from the non-conductive metal compound; and chemically reducing or plating the region generating the metal cores so as to form the conductive metal layer.

In the step of generating the metal cores in the method for forming the conductive pattern, a laser electromagnetic wave having a wavelength of approximately 1000 nm to 1200 nm may be irradiated at an average power of approximately 5 to 20 W, and therefore, the metal cores can be more effectively formed and a more excellent conductive pattern can be formed.

Further, when the step of generating metal cores by electromagnetic irradiation is carried out, a part of the non-conductive metal compound is exposed on the surface of the predetermined region of the resin product or the resin layer, and the metal cores are generated therefrom, thereby forming a surface (hereinafter, "adhesion-activated surface") that is activated to have higher adhesion. Subsequently, conductive metal ions are chemically reduced by chemical reduction of the first or second metal ion contained in the metal core or by electroless plating thereof, and thus the conductive metal layer can be formed on the adhesion-activated surface. Upon electroless plating, the metal cores function as a kind of seed to form a strong bond with the conductive metal ions in the plating solution, when the conductive metal ions are chemically reduced. As a result, the conductive metal layer can be selectively formed in an easier manner.

In the reduction or plating step, the predetermined region of the resin product or the resin layer which generates the metal cores may be treated with an acidic or basic solution containing a reducing agent, and this solution may contain one or more selected from the group consisting of formaldehyde, hypophosphite, dimethylamino borane (DMAB), diethylamino borane (DEAB) and hydrazine as the reducing agent. In another embodiment, the region may be treated with an electroless plating solution containing the reducing agent and conductive metal ions in the reduction step.

Meanwhile, the present invention provides a resin structure having the conductive pattern which is obtained by using the above described composition for forming the conductive pattern and the above described method for forming the conductive pattern. This resin structure may include the polymer resin substrate; the non-conductive metal compound that contains the first metal and the second metal, and is dispersed in the polymer resin substrate, wherein the non-conductive metal compound has a three-dimensional structure containing a plurality of first layers that contains at least one metal of the first and second metals and has edge-shared octahedrons two-dimensionally connected to each other, and a second layer that contains a metal different from that of the first layer and is arranged between the neighboring first layers;

an adhesion-activated surface having metal cores containing the first or second metal or the ion thereof which is exposed on the surface of the predetermined region of the polymer resin substrate; and a conductive metal layer formed on the adhesion-activated surface.

In the resin structure, the predetermined region where the adhesion-activated surface and the conductive metal layer are formed may correspond to the region of the polymer resin substrate to which electromagnetic wave is irradiated.

Advantageous Effects

According to the present invention, a composition for forming a conductive pattern, which is able to more effectively form a fine conductive pattern on a polymer resin substrate such as a variety of polymer resin products or resin layers by a very simple process of laser electromagnetic irradiation, a method for forming the conductive pattern using the same, and a resin structure having the conductive pattern may be provided.

The composition for forming the conductive pattern or the method for forming the conductive pattern can be used to very effectively form the conductive pattern for antenna on resin products, such as the case of a mobile phone, RFID tags, various sensors, MEMS structures or the like.

DETAILED DESCRIPTION OF THE EMBODIMENTS

Hereinafter, a composition for forming a conductive pattern, a method for forming the conductive pattern using the same, and a resin structure having the conductive pattern according to specific embodiments of the present invention will be described.

According to one embodiment of the present invention, provided is a composition for forming a conductive pattern by electromagnetic irradiation, including a polymer resin; and a non-conductive metal compound containing a first metal and a second metal, wherein the non-conductive metal compound has a three-dimensional structure containing a plurality of first layers that contains at least one metal of the first and second metals and has edge-shared octahedrons two-dimensionally connected to each other, and a second layer that contains a metal different from that of the first layer and is arranged between the neighboring first layers; and wherein a metal core containing the first or second metal or an ion thereof is formed from the non-conductive metal compound by electromagnetic irradiation.

After molding a polymer resin product or a resin layer using the composition for forming the conductive pattern according to one embodiment of the present invention, metal cores containing the first or second metal or the ion thereof can be formed from the non-conductive metal compound by laser electromagnetic irradiation. These metal cores are selectively exposed on a predetermined region to which electromagnetic wave is irradiated, and thus an adhesion-activated surface can be formed on the surface of the polymer resin substrate. Subsequently, by chemical reduction of the metal core containing the first or second metal or the ion thereof or by electroless plating using the metal cores as a seed and a plating solution containing the conductive metal ions, a conductive metal layer can be formed on the adhesion-activated surface containing the metal cores. Through this process, the conductive metal layer, namely, fine conductive pattern can be selectively formed only on the predetermined region of the polymer resin substrate, to which electromagnetic wave is irradiated.

In particular, one of factors causing formation of the metal cores and the adhesion-activated surface, and more excellent conductive pattern by electromagnetic irradiation is the specific three-dimensional structure of non-conductive metal compound included in the composition of one embodiment. An exemplary three-dimensional structure of non-conductive metal compound included in the composition for forming the conductive pattern according to one embodiment of the present invention is illustrated in FIG. 1.

Figure 1:
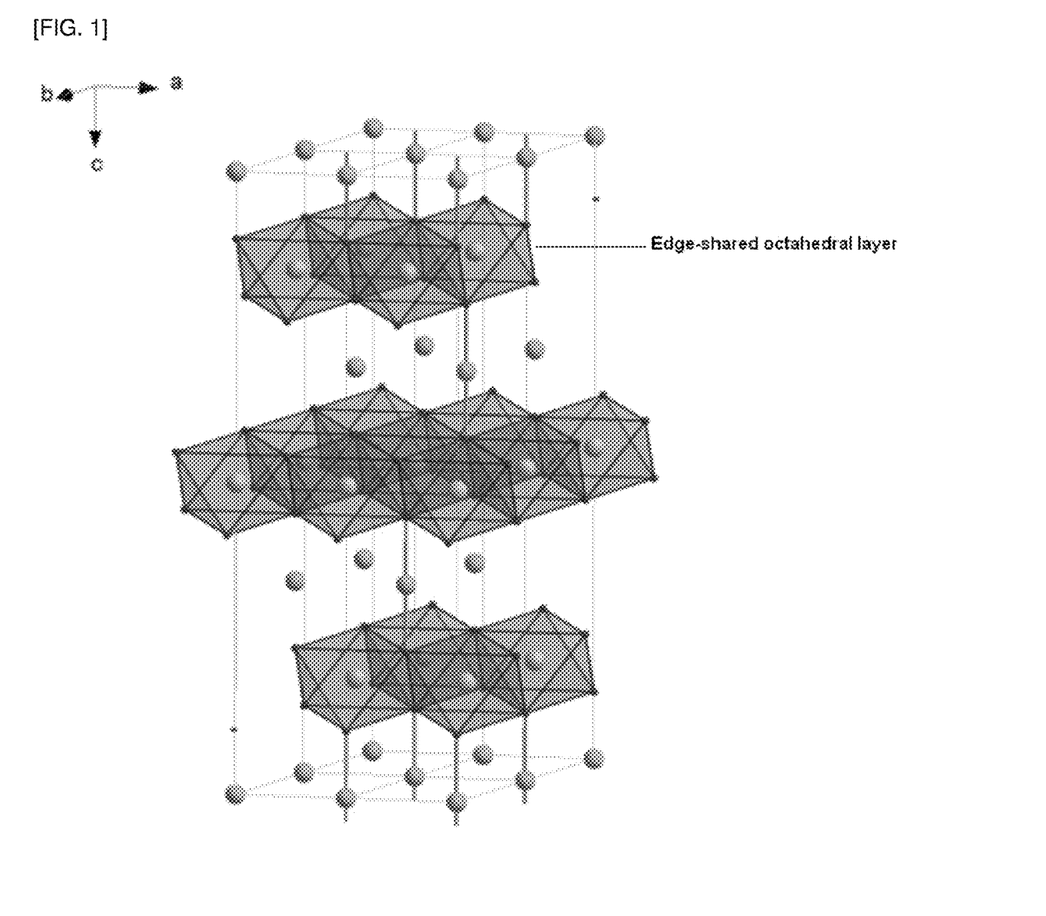
FIG. 1 illustrates an exemplary three-dimensional structure of a non-conductive metal compound that is included in a composition for forming a conductive pattern according to one embodiment of the present invention.

Referring to FIG. 1, in the three-dimensional structure of non-conductive metal compound, at least one metal of the first and second metals is contained in the first layer (edge-shared octahedral layer) which has edge-shared octahedrons two-dimensionally connected to each other. In addition, the three-dimensional structure of non-conductive metal compound includes a second layer that is arranged between the neighboring first layers, together with a plurality of the above described first layers. The second layer contains a metal different from that of the first layer, and for example, the metal other than one of the first and second metals which is contained in the first layer, and the metals of the second layer connect vertices of the octahedrons to each other between the neighboring first layers, thereby connecting two-dimensional structures thereof to each other.

Before electromagnetic irradiation, the non-conductive metal compound having the particular layered three-dimensional structure exhibits non-conductivity and has excellent compatibility with the polymer resin, and also is chemically stable in the solution used in reduction or plating treatment so as to maintain non-conductivity. Therefore, the non-conductive metal compound is uniformly dispersed in the polymer resin substrate and maintains chemically stable state to exhibit non-conductivity in the region to which electromagnetic wave is not irradiated.

In contrast, the first or second metal or ion thereof can be easily generated from the non-conductive metal compound in the predetermined region to which electromagnetic wave such as a laser is irradiated. In this regard, it is expected that easy generation of the metal or ion thereof from the non-conductive metal compound is attributed to the layered three-dimensional structure resulting from the sequential arrangement of the first layer and the second layer in the non-conductive metal compound. Since the non-conductive metal compound having the layered three-dimensional structure has lower vacancy formation energy of the second layer than a compound having a non-layered three-dimensional structure, the first or second metal or the ion thereof contained in the second layer can be more easily released. As such, the metal or the ion thereof is more easily released from the non-conductive metal compound by electromagnetic irradiation, which is one of factors causing formation of the metal cores and the adhesion-activated surface.

However, the experimental results of the present inventors revealed that formation of the metal cores and the adhesion-activated surface is not attributed only to the particular three-dimensional structure of the non-conductive metal compound. The present inventors continued to conduct experiments and to study, and they found that among the non-conductive metal compounds of the above particular three-dimensional structure, for example, a particular compound of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, etc. is selected and contained, and thus, the compound of one embodiment is able to show higher absorption and sensitivity with respect to electromagnetic wave such as a laser with a particular wavelength. In addition, when the after-mentioned conditions of the electromagnetic irradiation such as a laser are controlled, the metal core and adhesion-activated surface can be finally formed, and a more excellent fine conductive pattern can be formed by electromagnetic irradiation such as a laser and subsequent reduction or plating treatment.

Due to the above unique three-dimensional structure of the non-conductive metal compound and the properties thereof, and control of the above described conditions for metal core formation, therefore, the composition for forming the conductive pattern of one embodiment is able to easily form an excellent fine conductive pattern, compared to other composition containing a compound having a different three-dimensional structure such as spinel, or other composition without metal core formation. Furthermore, owing to these features, the composition for forming the conductive pattern of one embodiment is able to more easily form an excellent fine conductive metal layer, compared to other composition containing a non-conductive metal compound having a non-layered three-dimensional structure such as spinel, even though the amount of the non-conductive metal compound, more specifically, the amount or content of the first or second metal is reduced.

Additionally, because a compound having a different three-dimensional structure such as spinel, represented by $CuCr_2O_4$, etc. has a dark black color, a composition containing this non-conductive metal compound is not suitable for production of the polymer resin product or the resin layer having different colors. In contrast, the above non-conductive metal compound included in the composition for forming the conductive pattern of one embodiment, for example, $CuCrO_2$, etc. is allowed to produce the resin product or the resin layer having different colors such as green. Therefore, the composition for forming the conductive pattern of one embodiment can be suitably used for production of the resin product or the resin layer having the conductive pattern and various colors.

As such, when the composition for forming the conductive pattern according to one embodiment of the present invention is used, a fine conductive pattern can be easily formed on the polymer resin substrate by a very simple process of laser electromagnetic irradiation, and by reduction or plating treatment of the corresponding region. Moreover, owing to the unique three-dimensional structure or the metal core formation of the non-conductive metal compound, the conductive pattern can be more effectively and easily formed, and production of the resin product or the resin layer having various colors can be properly achieved to meet consumers' demand. Therefore, the composition for forming the conductive pattern is applied to very effectively form a conductive pattern for antenna on a variety of polymer resin products or resin layers, RFID tags, various sensors, MEMS structures, etc.

Meanwhile, the composition for forming the conductive pattern of one embodiment may exhibit reflectivity of approximately 25% or less or approximately 10 to 25% with respect to the wavelength corresponding to the infrared region, for example, a laser electromagnetic wave having a wavelength of approximately 1000 nm to 1200 nm. In a more specific embodiment, the composition for forming the conductive pattern may exhibit reflectivity of approximately 22% or less or approximately 12 to 22% with respect to the wavelength corresponding to the infrared region, for example, a laser electromagnetic wave having a wavelength of approximately 1060 nm to 1070 nm, or approximately 1064 nm.

The relative low reflectivity with respect to the laser electromagnetic wave may reflect high absorption and sensitivity with respect to the laser electromagnetic wave typically applied during metal core formation and subsequent conductive pattern formation. Therefore, when the composition for forming the conductive pattern of one embodiment showing the low reflectivity within the above described range is used, metal cores and adhesion-activated surface containing the same can be more effectively formed by electromagnetic irradiation such as a laser, and as a result, it is possible to form a more excellent conductive pattern.

Such low reflectivity of the composition for forming the conductive pattern can be achieved by use of the non-conductive metal compound having the particular three-dimensional structure, in particular, by use of a specific compound such as $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, etc., and by combination of the specific non-conductive metal compound and the proper polymer resin and compositions thereof. The proper non-conductive metal compound and polymer resin, and compositions thereof will be described in more detail below.

In the composition for forming the conductive pattern of one embodiment, the three-dimensional structure of the non-conductive metal compound may be a layered three-dimensional structure which is defined as a space group of $R\bar{3}m$ or $P6_3/mmc$. Due to the layered three-dimensional structure, vacancy formation energy of the second layer can be further lowered, compared to non-layered three-dimensional structure. Therefore, the metal or ion thereof contained in the second layer can be more easily released. Thus, use of the composition including the non-conductive metal compound having the layered three-dimensional structure can be one of main factors causing effective formation of metal cores and conductive metal layer (conductive pattern) while reducing the amount of the non-conductive metal compound.

In this regard, the non-conductive metal compound having the layered three-dimensional structure may be a compound containing X (oxygen, nitrogen, or sulfur) in addition to the first and second metals, and may have a three-dimensional structure of FIG. 1. Referring to FIG. 1, in the layered three-dimensional structure, at least one metal of the first and second metals and atoms of X form edge-shared octahedrons, which are arranged in the two-dimensionally connected structure so as to form the first layer (edge-shared octahedral layer). In the three-dimensional structure, a metal different from that of the first layer, for example, the metal other than one of the first and second metals which is contained in the first layer is arranged between the neighboring first layers, so as to form the second layer. The metal constituting the second layer connect the vertices of the octahedrons of the first layer to each other, thereby connecting the two-dimensional structures to each other.

In this regard, the first or second metal constituting the second layer may be one or more selected from the group consisting of Cu, Ag and Ni, and may be a metal source released from the non-conductive metal compound by electromagnetic irradiation, and the metal constituting the first layer may be one or more metals selected from the group consisting of Cr, Mo, Mn, Fe, Sn and W.

In a more specific embodiment, it was found that among the non-conductive metal compounds having the above layered three-dimensional structure, one or more compounds are selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$ and $CuSnO_2$, and then used so as to more effectively form the metal core and the adhesion-activated surface containing the same. Therefore, by using the particular non-conductive metal compound and controlling the conditions of the electromagnetic irradiation such as a laser described below, the metal cores can be properly formed and the superior conductive pattern can be formed.

In contrast, if a non-conductive metal compound has the layered three-dimensional structure, but it is an inappropriate compound such as $CuNiO_2$ in Comparative Example described below, or conditions of electromagnetic irradiation such as a laser are not controlled within the proper range, metal cores may not be formed, and in this case, an excellent conductive pattern having excellent adhesion to the polymer resin may not be formed. Meanwhile, when the composition for forming the conductive pattern of one embodiment is irradiated with a wavelength corresponding to the infrared region, for example, a laser electromagnetic wave having a wavelength of approximately 1000 nm to 1200 nm, or approximately 1060 nm to 1070 nm, or approximately 1064 nm at an average power of approximately 5 to 20 W, or approximately 7 to 15 W, metal cores can be formed in the region, to which the electromagnetic wave is irradiated. As the conditions of electromagnetic irradiation such as a laser are controlled within the proper range, metal cores can be more effectively formed in the laser-irradiated region of the composition of one embodiment, resulting in formation of the superior conductive pattern. However, the conditions of electromagnetic irradiation for metal core formation may vary depending on the specific type or the composition of the non-conductive metal compound and the polymer resin which are practically used.

Further, in the composition for forming the conductive pattern of one embodiment, any thermosetting resin or thermoplastic resin capable of forming various polymer resin products or resin layers can be used as the polymer resin without limitation. In particular, the non-conductive metal compound having the particular three-dimensional structure described above exhibits excellent compatibility and uniform dispersibility with respect to various polymer resins, and the composition of one embodiment includes various polymer resins to be molded to various resin products or resin layers. Specific examples of the polymer resin may include a polyalkylene terephthalate resin such as an ABS resin, a polybutyleneterephthalate resin or a polyethyleneterephthalate resin, a polycarbonate resin, a polypropylene resin or a polyphthalamide resin, and also other various polymer resins. Among them, the ABS resin or the polycarbonate resin is preferably used as the polymer resin, in order to ensure formation of the metal cores and the excellent conductive pattern.

Further, in the composition for forming the conductive pattern, the non-conductive metal compound may be included in an amount of approximately 1 to 10% by weight, or approximately 1.5 to 7% by weight, with respect to the total composition, and the polymer resin may be included in the remaining amount. When the content is within the above range, the polymer resin product or the resin layer formed from the composition properly maintains the basic physical properties such as mechanical property, and the conductive pattern is also preferably formed on a predetermined region by electromagnetic irradiation. Further, formation of the metal cores and the excellent conductive pattern is more preferably ensured by the composition ratio.

Additionally, the composition of one embodiment includes the non-conductive metal compound having the particular three-dimensional structure to form metal cores or the like, thereby more effectively forming the conductive pattern by electromagnetic irradiation even though it includes a lower amount of non-conductive metal compound. Therefore, owing to the lower content of the non-conductive metal compound, it is easy to maintain excellent basic physical properties of the resin product or the resin layer.

The composition for forming the conductive pattern may further include one or more additives selected from the group consisting of a heat stabilizer, a UV stabilizer, a flame retardant, a lubricant, an antioxidant, an inorganic filler, a color additive, an impact modifier and a functional modifier, in addition to the above described polymer resin and the predetermined non-conductive metal compound. Various other additives known to be used in the composition for molding the resin product can be also used without limitation.

Meanwhile, according to another embodiment of the present invention, provided is a method for forming the conductive pattern on the polymer resin substrate such as the resin product or the resin layer by direct electromagnetic irradiation using the above described composition for forming the conductive pattern. The method for forming the conductive pattern may include the steps of molding the above composition for forming the conductive pattern to the resin product or applying it to another product so as to form the resin layer; irradiating an electromagnetic wave to a predetermined region of the resin product or the resin layer so as to release metal cores containing the first or second metal or the ion thereof from the non-conductive metal compound; and chemically reducing or plating the region releasing the metal cores so as to form the conductive metal layer.

Hereinafter, each step of the method for forming the conductive pattern according to another embodiment will be described with reference to the accompanying drawings. For reference, FIGS. 2a to 2c illustrate a schematic diagram showing each step of an exemplary method for forming the conductive pattern; and FIG. 3 is an electron microscopic image showing an adhesion-activated surface containing metal cores, which is formed on the surface of a polymer resin substrate by electromagnetic irradiation in an exemplary method for forming the conductive pattern.

In the method for forming the conductive pattern, first, the above composition for forming the conductive pattern is molded to the resin product or applied to another product so as to form the resin layer. In the molding of the resin product or the formation of the resin layer, a method for molding a product or for forming the resin layer using the typical polymer resin composition can be applied without limitation. For example, when the resin product is molded using the composition, the composition for forming the conductive pattern is extruded and cooled to form pellets or particles, which are subjected to injection molding to have a desired shape, thereby manufacturing a variety of polymer resin products.

The polymer resin product or the resin layer thus formed may have the above described non-conductive metal compound of the particular three-dimensional structure which is uniformly dispersed on the resin substrate formed from the polymer resin. In particular, because the non-conductive metal compound has excellent compatibility, sufficient solubility, and chemical stability for various polymer resins, it is uniformly dispersed throughout the resin substrate and maintains non-conductivity.

Figure 2A:
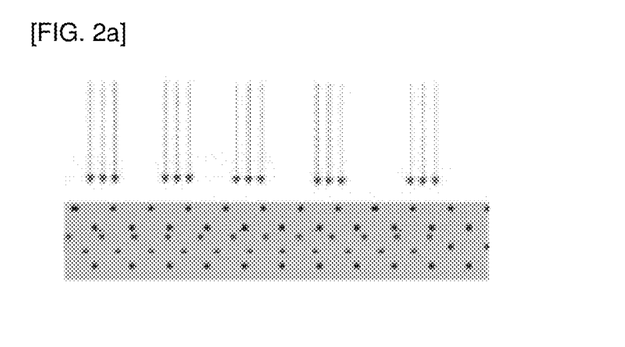
FIGS. 2a to 2c illustrate a schematic diagram showing each step of an exemplary method for forming a conductive pattern according to another embodiment of the present invention.
Figure 2B:
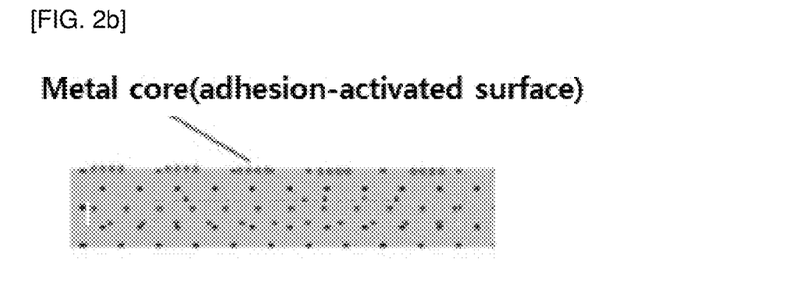
Figure 2C:
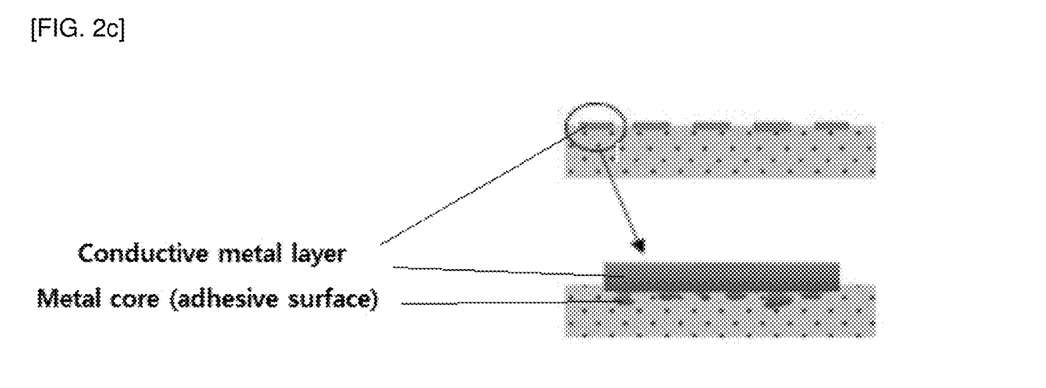
Figure 3:
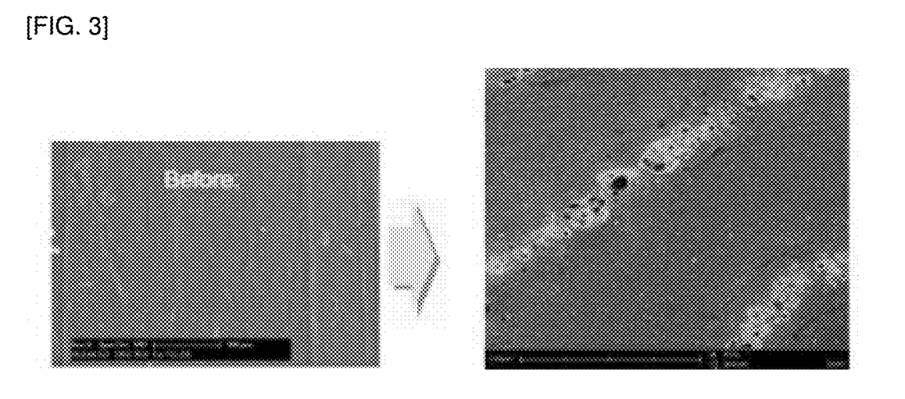
FIG. 3 is an electron microscopic image showing an adhesion-activated surface containing metal cores, which is formed on the surface of a polymer resin substrate by electromagnetic irradiation in an exemplary method for forming a conductive pattern according to another embodiment of the present invention.

After forming the polymer resin product or the resin layer, as illustrated in FIG. 2a, an electromagnetic wave such as a laser can be irradiated to a predetermined region of the resin product or the resin layer, on which the conductive pattern is intended to be formed. When the electromagnetic wave is irradiated, the first or second metal or the ion thereof can be released from the non-conductive metal compound, and metal cores containing the same can be generated.

More specifically, when the step of generating metal cores by electromagnetic irradiation is carried out, a part of the non-conductive metal compound is exposed on the surface of the predetermined region of the resin product or the resin layer, and metal cores are generated therefrom, and thus the adhesion-activated surface which is activated to have higher adhesion can be formed. Since the adhesion-activated surface is selectively formed on the specific region to which the electromagnetic wave is irradiated, the conductive metal layer can be selectively formed on the predetermined region of the polymer resin substrate more favorably, when conductive metal ions are chemically reduced by chemical reduction of the first or second metal ions contained in the metal core and the adhesion-activated surface, or electroless plating thereof in the reduction or plating step described below. More specifically, upon electroless plating, the metal cores function as a kind of seed to form a strong bond with the conductive metal ions contained in the plating solution, when the conductive metal ions are chemically reduced. As a result, a more excellent conductive metal layer can be selectively formed in an easier manner.

Meanwhile, in the step of generating metal cores, a laser electromagnetic wave among electromagnetic waves can be irradiated, for example, a wavelength corresponding to the infrared region. For example, a laser electromagnetic wave having a wavelength of approximately 1000 nm to 1200 nm, or approximately 1060 nm to 1070 nm, or approximately 1064 nm can be irradiated at an average power of approximately 5 to 20 W or approximately 7 to 15 W.

By the laser electromagnetic irradiation, formation of the metal cores from the non-conductive metal compound can be more preferably ensured, and the adhesion-activated surface including the same can be selectively formed on the predetermined region and exposed.

Meanwhile, after the step of generating metal cores, the step of forming the conductive metal layer by chemically reducing or plating the region generating metal cores can be carried out, as illustrated in FIG. 2c. As a result of the reduction or plating step, the conductive metal layer can be selectively formed on the predetermined region exposing the metal core and the adhesion-activated surface, and on the other region, the chemically stable non-conductive metal compound maintains its non-conductivity. Therefore, the fine conductive pattern can be selectively formed only on the predetermined region of the polymer resin substrate.

In the reduction or plating step, the predetermined region of the resin product or the resin layer which generates metal cores can be treated with an acidic or basic solution containing a reducing agent, and this solution may contain one or more selected from the group consisting of formaldehyde, hypophosphite, dimethylamino borane (DMAB), diethylamino borane (DEAB) and hydrazine as the reducing agent. In another embodiment, the region can be treated with an electroless plating solution containing the reducing agent and conductive metal ions in the reduction step.

As the reduction or plating step is carried out, the first or second metal ions contained in the metal core are reduced, or the conductive metal ions in the plating solution are chemically reduced in the region where the metal cores are formed as a seed, and therefore, an excellent conductive pattern can be selectively formed on the predetermined region. In this regard, the metal core and the adhesion-activated surface may form a strong bond with chemically reduced conductive metals, and as a result, the conductive pattern can be more easily formed selectively on the predetermined region.

According to still another embodiment, provided is a resin structure having the conductive pattern which is obtained by using the composition for forming the conductive pattern and the method for forming the conductive pattern described above. The resin structure may include a polymer resin substrate; a non-conductive metal compound that contains a first metal and a second metal, and is dispersed in a polymer resin substrate, wherein the non-conductive metal compound has a three-dimensional structure containing a plurality of first layers that contains at least one metal of the first and second metals and has edge-shared octahedrons two-dimensionally connected to each other, and a second layer that contains a metal different from that of the first layer and is arranged between the neighboring first layers;

an adhesion-activated surface having metal cores containing the first or second metal or the ion thereof which is exposed on the surface of a predetermined region of the polymer resin substrate; and a conductive metal layer formed on the adhesion-activated surface.

In the resin structure, the predetermined region where the adhesion-activated surface and the conductive metal layer are formed may correspond to the region of the polymer resin substrate to which the electromagnetic wave is irradiated. In addition, the first or second metal or the ion thereof included in the metal cores of the adhesion-activated surface may be derived from the non-conductive metal compound. Meanwhile, the conductive metal layer may be derived from the first or second metal or from the conductive metal ion contained in the electroless plating solution.

Meanwhile, the resin structure may further include residues which are dispersed in the polymer resin substrate and derived from the non-conductive metal compound. These residues may have vacancy resulting from the release of at least a part of the first or second metal from the three-dimensional structure of the non-conductive metal compound.

The above described resin structure may be applied to a variety of resin products or resin layers such as a mobile phone case of having the conductive pattern for antenna, or to a variety of resin products or resin layers having the conductive pattern, such as RFID tags, sensors, or MEMS structure.

Figure 4:
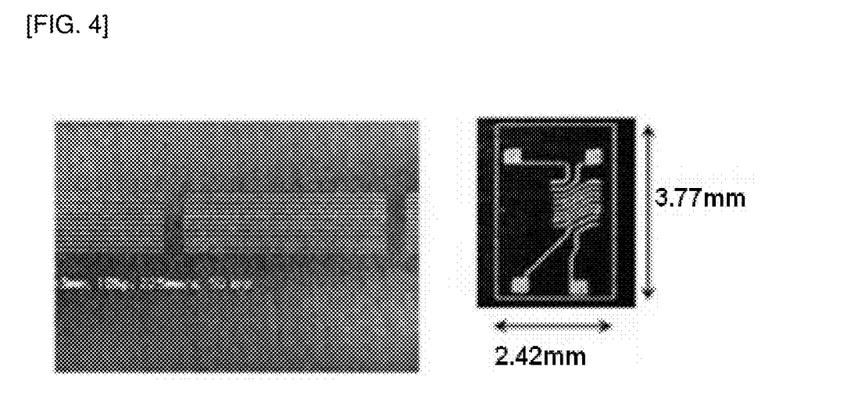
FIG. 4 is an image showing that a conductive pattern is formed on the polymer resin substrate according to the method for forming a conductive pattern according to another embodiment of the present invention.

As described above, according to embodiments of the present invention, a variety of resin products having fine conductive patterns can be easily formed by a very simple method of laser electromagnetic irradiation and reduction or plating. One example of the fine conductive pattern which is formed on the resin product or the resin layer is illustrated in FIG. 4. As supported by FIG. 4, the fine conductive pattern can be easily formed on a variety of the resin products or the resin layers by the very simple method as described above, and thus the present invention greatly contributes to development of resin products having many forms, including novel resin products which have been never proposed.

Hereinafter, the actions and effects of the present invention will be described in more detail with reference to the specific Examples. However, these examples are illustrative only and the scope of the invention is not limited thereto.

Preparation Example 1: Synthesis of
Non-Conductive Metal Compound $CuCrO_2$

Figure 5:
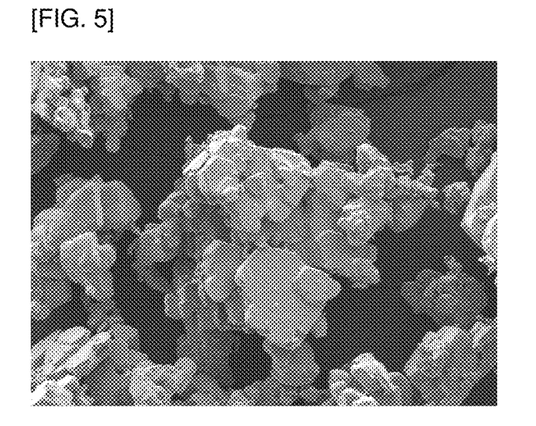
FIGS. 5 and 6 show an electron microscopic image and X-ray diffraction pattern of $CuCrO_2$ power that is obtained in Preparation Example 1, respectively.
Figure 6:
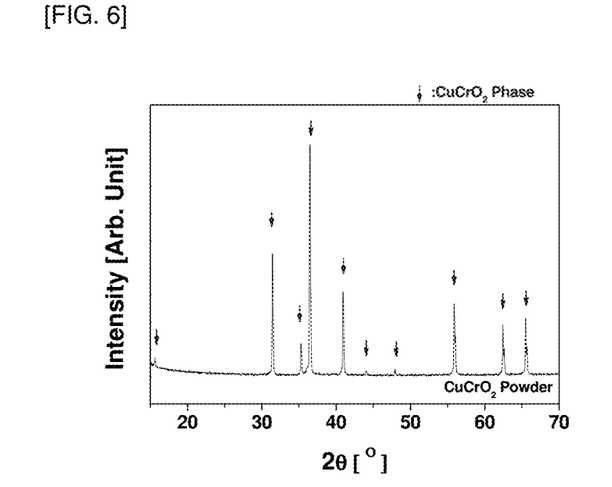

The raw materials, CuO and $Cr_2O_3$ were homogeneously mixed with each other at a molar ratio of 2:1 by ball milling for 6 hours. Thereafter, the mixture was fired under the conditions of atmospheric pressure and 1050° C. for 2 hours to prepare a powder having a chemical formula of $CuCrO_2$. After the preparation, additional pulverization was carried out to prepare $CuCrO_2$ powder to be used in the following Examples. Electron microscopic image and X-ray diffraction pattern of the powder are shown in FIGS. 5 and 6, respectively.

The electron microscopy and X-ray diffraction analysis showed that the non-conductive metal compound has a layered crystal structure, and the layered three-dimensional structure as illustrated in FIG. 1.

Example 1: Formation of Conductive Pattern by Direct Laser Irradiation

The non-conductive metal oxide powder ($CuCrO_2$) obtained in Preparation Example 1 was used together with a polycarbonate resin. Additionally, a heat stabilizer (IR1076, PEP36), a UV stabilizer (UV329), a lubricant (EP184), and an impact modifier (S2001) which are additives for processing and stabilization were also used to prepare a composition for forming a conductive pattern by electromagnetic irradiation.

The non-conductive metal compound of 5% by weight, the impact modifier of 4% by weight, and other additives including the lubricant of 1% by weight, based on the polycarbonate resin, were mixed, and the mixture was extruded at 260 to 280° C. for blending so as to give a pellet-type resin composition. The pellet-type resin composition thus extruded was subjected to injection molding at approximately 260 to 280° C. to give a substrate having a diameter of 100 mm and a thickness of 2 mm.

Figure 7:
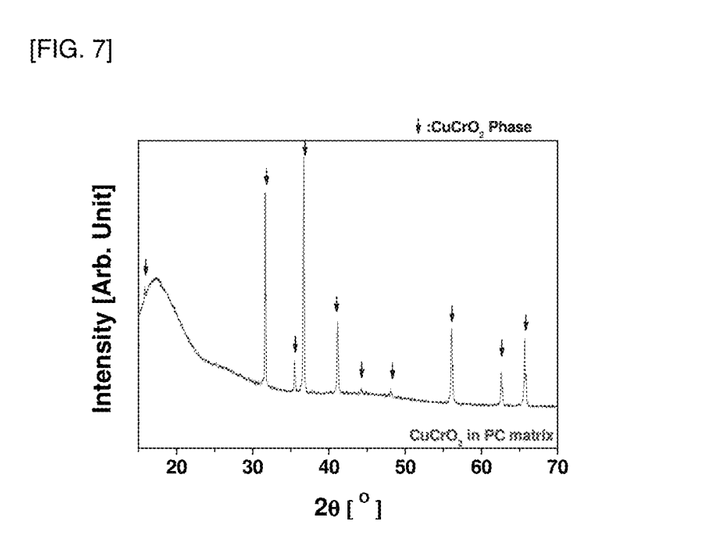
FIGS. 7 and 8 show the result of X-ray diffraction analysis and an electron microscopic image of the fracture surface of the resin substrate, after the resin substrate containing $CuCrO_2$ powder was obtained in Example 1, respectively.
Figure 8:
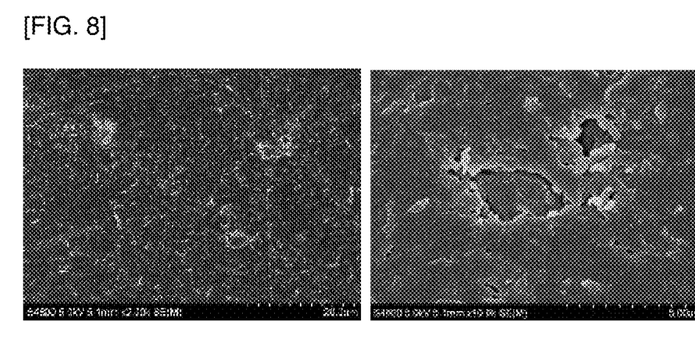

The substrate thus obtained was subjected to X-ray diffraction analysis and the results are shown in FIG. 7. Further, the distribution of non-conductive metal compound particles in the substrate was analyzed by electron microscopy and the results are shown in FIG. 8. For reference, FIG. 8 is an electron microscopic image of the fracture surface of the substrate, and the right image of FIG. 8 is a magnification of the left image. Referring to FIGS. 7 and 8, it was confirmed that the non-conductive metal compound was favorably dispersed in the polycarbonate resin without degradation, before laser irradiation (FIG. 7), and these non-conductive metal compound particles were uniformly dispersed in the polycarbonate resin (FIG. 8).

Figure 9:
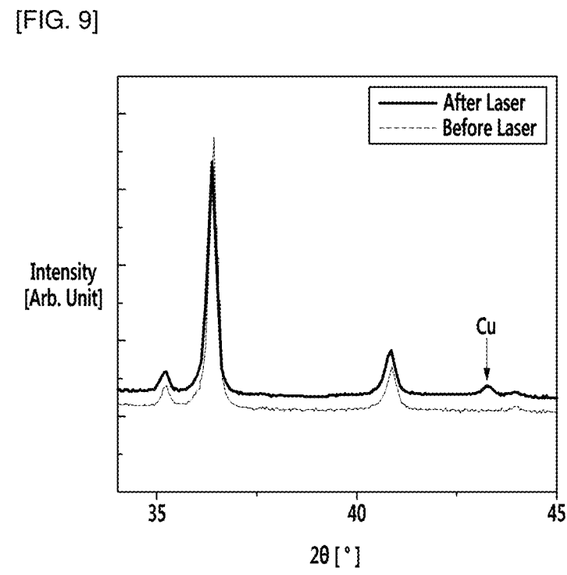
FIGS. 9 and 10 show the result of X-ray diffraction analysis and an electron microscopic image to examine whether metal cores are formed on the resin substrate after laser irradiation in Example 1, respectively.
Figure 10:
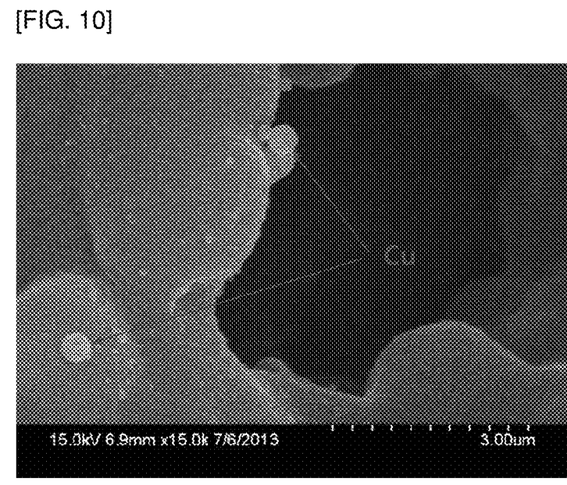

Meanwhile, the resin substrate manufactured as above was irradiated with a laser having a wavelength of 1064 nm under the conditions of 40 kHz, 10 W using Nd-YAG laser so as to activate the surface. After laser irradiation, formation of the copper-containing metal cores in the polycarbonate resin was analyzed and confirmed by electron microscopy and XRD and the results are shown in FIGS. 9 and 10, respectively. Referring to FIGS. 9 and 10, a part of Cu or ion thereof derived from the $CuCrO_2$ particles was reduced after laser irradiation, leading to formation of metal seed (that is, metal core).

Figure 11:
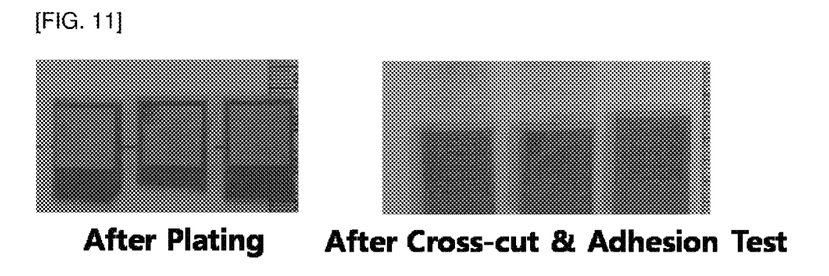
FIG. 11 shows the conductive pattern formed immediately after plating and the conductive pattern after adhesion test (Cross-cut test in accordance with the standard ISO 2409) in example 1.
Figure 12:
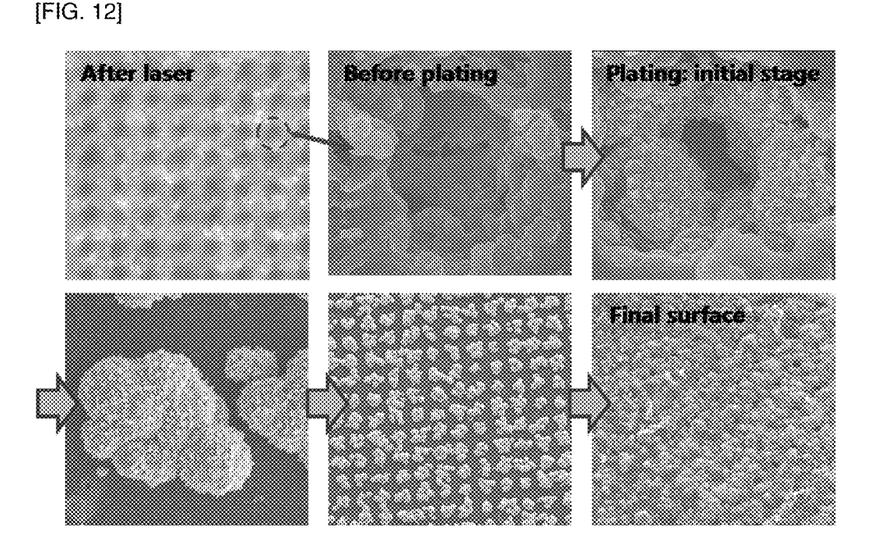
FIG. 12 shows electron microscopic images of the surface conditions (copper growth on the surface) during the plating process and after formation of the final conductive pattern, after laser irradiation in Example 1.

Subsequently, the resin substrate of which surface was activated by laser irradiation was subjected to an electroless plating process as follows. The plating solution was prepared by dissolving 3 g of copper sulfate, 14 g of Rochelle salt, and 4 g of sodium hydroxide in 100 ml of deionized water. 1.6 ml of formaldehyde as a reducing agent was added to 40 ml of the plating solution thus prepared. The resin substrate of which surface was activated by laser was immersed in the plating solution for 3 to 5 hours, and then washed with distilled water. Adhesion performance of the conductive pattern (or plating layer) thus formed was evaluated according to the standard ISO 2409. The image of the conductive pattern formed immediately after plating and the image after the adhesion performance test (Cross-cut test according to the standard ISO 2409) are shown in FIG. 11, and electron microscopic images of the surface conditions (copper growth on the surface) during the plating process and after formation of the final conductive pattern, after laser irradiation were observed, as shown in FIG. 12. FIGS. 11 and 12 confirmed that a conductive pattern having excellent adhesion was formed on the polycarbonate resin substrate.

Example 2: Formation of Conductive Pattern by Direct Laser Irradiation

A composition for forming a conductive pattern was prepared in the same manner as in Example 1, except that the non-conductive metal compound powder ($CuCrO_2$) of 3% by weight was used in Example 1, and a resin structure having the conductive pattern was manufactured therefrom. Formation of metal cores was confirmed in the same manner as in Example 1. It was confirmed that a conductive pattern having excellent adhesion was formed on the polycarbonate resin substrate, in the same manner as in Example 1 (see the following Experimental Example and Table 1).

Example 3: Formation of Conductive Pattern by Direct Laser Irradiation

Figure 13:
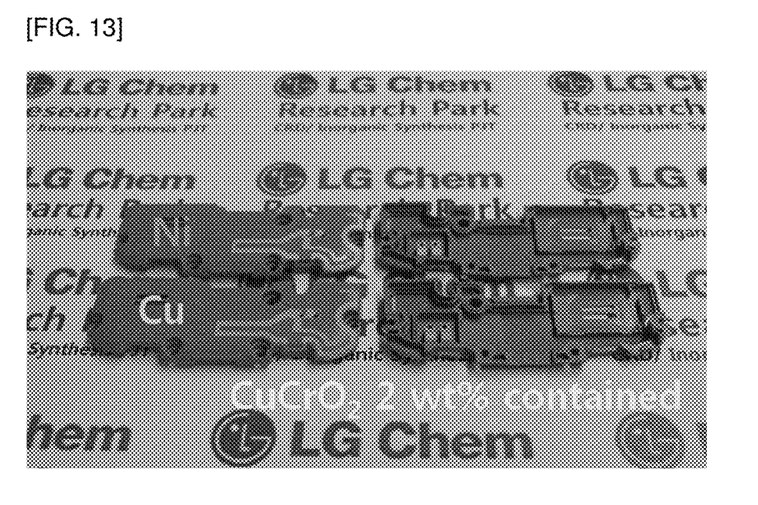
FIG. 13 is a photograph showing an exemplary actual product after formation of the conductive pattern in Example 3.

A composition for forming a conductive pattern was prepared in the same manner as in Example 1, except that the non-conductive metal compound powder ($CuCrO_2$) of 2% by weight was used in Example 1, and a resin structure having the conductive pattern was manufactured therefrom. Formation of metal cores was confirmed in the same manner as in Example 1. In addition, a product having the conductive pattern was practically manufactured using the resin structure, and its photograph is shown in FIG. 13. Therefore, it was confirmed that a conductive pattern having excellent adhesion was formed on the polycarbonate resin substrate, and in particular, a copper- or nickel/copper-plated conductive pattern can be uniformly formed on the region irradiated with laser.

Comparative Example 1: Formation of Conductive Pattern by Direct Laser Irradiation A composition for forming a conductive pattern was prepared in the same manner as in Example 1, except that $CuNiO_2$ was used as the non-conductive metal compound, instead of $CuCrO_2$, and laser irradiation was carried out at a power of 3 W instead of 10 W, and a resin structure having the conductive pattern was manufactured therefrom.

Figure 14:
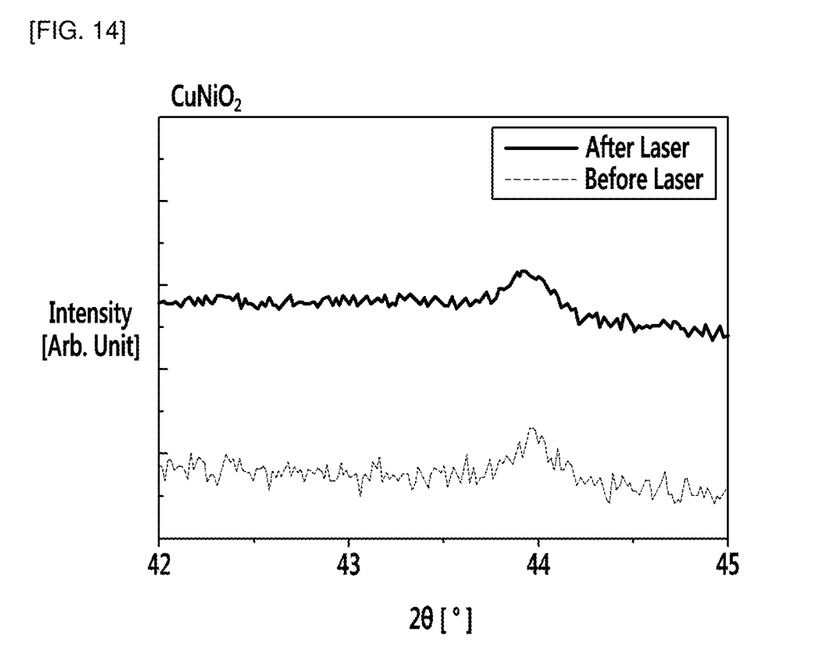
FIGS. 14 and 15 show the result of X-ray diffraction analysis and an electron microscopic image of the laser-irradiated surface to examine whether metal cores are formed on the resin substrate after laser irradiation in Comparative Example 1, respectively.
Figure 15:
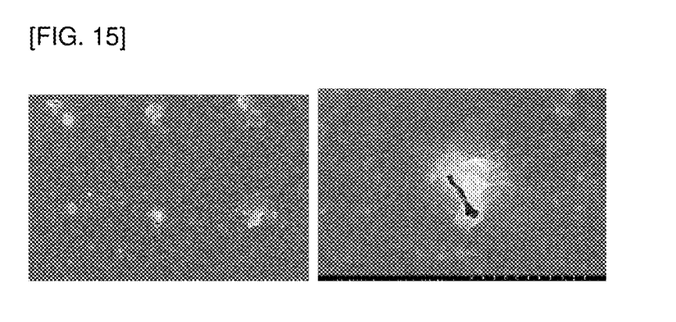

After laser irradiation, formation of the copper-containing metal cores in the polycarbonate resin was analyzed and confirmed by electron microscopy and XRD, and the results are shown in FIGS. 14 and 15, respectively. Referring to FIGS. 14 and 15, because of the inappropriate laser irradiation conditions, the non-conductive metal compound was hardly exposed to the laser even after laser irradiation, and sensitivity of the non-conductive metal compound to the laser was not sufficient, and thus no metal seed (that is, metal core) derived from Cu, etc. was formed.

Thereafter, plating of the conductive pattern was carried out to form a conductive pattern in the same manner as in Example 1, and then adhesion of the conductive pattern to the polycarbonate resin substrate and its integrity were measured and evaluated in the same manner as in Example 1 (see the following Experimental Example and Table 1). Accordingly, it was confirmed that a conductive pattern having poor adhesion was formed on the polycarbonate resin substrate in Comparative Example 1.

Experimental Example: Test on Reflectivity of Resin Substrate to Laser and Test on Adhesion of Conductive Pattern First, in Examples 1 to 3 and Comparative Example 1, reflectivity of the resin substrate immediately before laser irradiation to the laser with a wavelength of 1064 nm was measured using a UV vis-NIR spectrometer. The measurement results are summarized in the following Table 1.

Referring to Table 1, it was found that the substrates of Examples 1 to 3 showed relatively low reflectivity to the laser, indicating high absorption and sensitivity to the laser, whereas the substrate of Comparative Example 1 showed high reflectivity, and low absorption and sensitivity to the laser, suggesting that formation of metal cores and excellent conductive pattern is possible by using the compositions of Examples, compared to the compositions of Comparative Example.

After formation of the final conductive pattern in Examples 1 to 3 and Comparative Example 1, adhesion of each conductive pattern was evaluated by a cross-cut test according to the standard ISO 2409, and the results are shown in Table 1.

According to Table 1, the conductive pattern showing excellent adhesion to the polycarbonate resin was formed in Examples 1 to 3, whereas the conductive pattern with poor adhesion was formed in Comparative Example 1, which was easily removed.

TABLE 1

|  | Example 1 | Example 2 | Example 3 | Comparative Example 1 |
| --- | --- | --- | --- | --- |
| Polycarbonate resin [wt %] | 90 | 92 | 93 | 90 |
| Non-conductive metal compound [wt %] | 5 | 3 | 2 | 5 |
| Impact modifier [S2001, wt %] | 4 | 4 | 4 | 4 |
| Other additive [wt %] | 1 | 1 | 1 | 1 |
| Reflectivity to laser [%, at 1064 nm] | 19.3 | 20.1 | 21.1 | 30.5 |
| Laser irradiation power [W, at 1064 nm] | 10 | 10 | 10 | 3 |
| Result of adhesion test (ISO Class) | 0 | 0 | 1 | 5 |

The invention claimed is:

1. A composition for forming a conductive pattern by electromagnetic irradiation, comprising:
   a polymer resin; and
   a non-conductive metal compound containing a first metal and a second metal,
   wherein the non-conductive metal compound has a three-dimensional structure containing a plurality of first layers that contain at least one metal of the first and second metals and has edge-shared octahedrons two-dimensionally connected to each other, and
   a second layer that contains a metal different from that of the first layer and is arranged between the neighboring first layers; and
   wherein a metal core containing the first or second metal or an ion thereof is formed from the non-conductive metal compound by electromagnetic irradiation; and
   wherein the composition exhibits reflectivity of 25% or less with respect to a laser electromagnetic wave having a wavelength of 1000 nm to 1200 nm; and
   wherein the metal core is formed by irradiating a laser electromagnetic wave having a wavelength of 1000 nm to 1200 nm at an average power of 5 to 20 W.

2. The composition of claim 1, wherein the non-conductive metal compound has a space group of $R\bar{3}m$ or $P6_3/mmc$.

3. The composition of claim 1, wherein the non-conductive metal compound is a compound containing the first and second metals and X, wherein X is oxygen, nitrogen, or sulfur, and the non-conductive metal compound has a three-dimensional structure containing a plurality of the first layers in which at least one metal of the first and second metals and atoms of X form edge-shared octahedrons arranged in the two-dimensionally connected structure, and
   a second layer that contains a metal different from that of the first layer, in which the metal connects the two-dimensional structure of the octahedrons to each other between the neighboring first layers.

4. The composition of claim 1, wherein the non-conductive metal compound includes one or more compounds selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$ and $CuSnO_2$.

5. The composition of claim 1, wherein the polymer resin includes a thermosetting resin or a thermoplastic resin.

6. The composition of claim 5, wherein the polymer resin includes one or more selected from the group consisting of an ABS resin, a polyalkylene terephthalate resin, a polycarbonate resin, a polypropylene resin, and a polyphthalamide resin.

7. The composition of claim 1, wherein the non-conductive metal compound is included in an amount of 1 to 10% by weight, with respect to the total composition.

8. The composition of claim 1, further comprising one or more additives selected from the group consisting of a heat stabilizer, a UV stabilizer, a flame retardant, a lubricant, an antioxidant, an inorganic filler, a color additive, an impact modifier, and a functional modifier.

9. A method for forming a conductive pattern by electromagnetic irradiation, comprising the steps of:
   molding the composition of claim 1 to a resin product or applying it to another product to form a resin layer;
   irradiating a region of the resin product or the resin layer with electromagnetic irradiation to generate metal cores containing the first or second metal or the ion thereof from the non-conductive metal compound; and
   chemically reducing or plating the region containing the metal cores to form a conductive metal layer.

10. The method of claim 9, wherein the electromagnetic irradiation is produced by a laser having a wavelength of 1000 nm to 1200 nm at an average power of 5 to 20 W.

11. The method of claim 9, wherein in the irradiating step, a part of the non-conductive metal compound is exposed on the surface of the region of the resin product or the resin layer, and the metal cores are generated therefrom, thereby forming an adhesion-activated surface that is activated to have higher adhesion.

12. The method of claim 11, wherein the conductive metal layer is formed on the adhesion-activated surface by chemical reduction of the first or second metal ion contained in the metal core or by electroless plating thereof.

13. The method of claim 9, wherein in the reduction or plating step, the region containing the metal cores is treated with an acidic or basic solution containing a reducing agent.

14. The method of claim 13, wherein the reducing agent includes one or more compounds selected from the group consisting of formaldehyde, hypophosphite, dimethylamino borane (DMAB), diethylamino borane (DEAB) and hydrazine.

15. A resin structure having a conductive pattern, comprising:
   a composition of claim 1 having an adhesion-activated surface comprising the metal cores containing the first or second metal or the ion thereof which is exposed on the surface of a region of the polymer resin; and
   a conductive metal layer formed on the adhesion-activated surface.

16. The resin structure of claim 15, wherein the region containing the adhesion-activated surface and the conductive metal layer is the region of the polymer resin exposed to the laser irradiation.

* * * * *